United States Patent
Lee et al.

(10) Patent No.: US 6,878,987 B2
(45) Date of Patent: Apr. 12, 2005

(54) SPLIT GATE MEMORY DEVICE

(75) Inventors: Og-Hyun Lee, Kyunggi-do (KR); Yong Suk Choi, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/429,866

(22) Filed: May 6, 2003

(65) Prior Publication Data

US 2003/0214864 A1 Nov. 20, 2003

(30) Foreign Application Priority Data

May 15, 2002 (KR) .................................. 10-2002-0026907

(51) Int. Cl.[7] .............................................. H01L 29/788
(52) U.S. Cl. .................... 257/315; 257/315; 257/314
(58) Field of Search .................... 257/315, 314, 257/316, 311, 320, 321, 322; 438/266, 261

(56) References Cited

U.S. PATENT DOCUMENTS 5,879,993 A * 3/1999 Chien et al. ............... 438/266
6,133,097 A * 10/2000 Hsieh et al. ............... 438/266
2002/0068403 A1 * 6/2002 Huang ........................ 438/261

FOREIGN PATENT DOCUMENTS

JP 2001-085544 3/2001
KR 2001-91532 10/2001

* cited by examiner

Primary Examiner—David Nelms
Assistant Examiner—Thinh T Nguyen
(74) Attorney, Agent, or Firm—Lee, Sterba & Morse, P.C.

(57) ABSTRACT

A split gate memory device and fabricating method thereof, wherein gate insulating and polysilicon layers are sequentially formed on a substrate. The polysilicon layer is patterned and a capping insulating layer is formed on portions thereof. A pair of self-aligned control gates having identical bottom widths are formed with a tunnel insulating layer interposed between the control gates and sidewalls of the polysilicon layer pattern and capping insulating layer. The tunnel insulating layer, patterned polysilicon layer and gate insulating layer are selectively etched to expose a portion of the substrate thereby forming a pair of floating gates. Ions are implanted into the exposed substrate and portions of the substrate adjoining the control gates to form a common source region and a drain region, respectively. The capping insulating layer on the floating gate protects an acute section of the tunnel insulating layer from attack during the etching and ion implantation.

9 Claims, 11 Drawing Sheets

SPLIT GATE MEMORY DEVICE

BACKGROUND OF THE INVENTION

1. Field of the Invention

The present invention relates to memory device and fabricating method thereof. More specifically, the present invention relates to a split gate memory device and fabricating method thereof.

2. Description of the Related Art

A non-volatile memory such as a ferro-electric random access memory (FRAM), an erasable and programmable read only memory (EPROM), and an electrically erasable and programmable read only memory (EEPROM) has lately attracted considerable attention. EPROM and EEPROM accumulate electrons in a floating gate to memorize data by changes of a threshold voltage that occurs based on the presence of electrons.

EEPROM may be categorized as either a stack gate or a split gate. The stack gate suffers from the problem that data is over erased during erasing, whereas the split gate may avoid this problem.

Figure 1A:
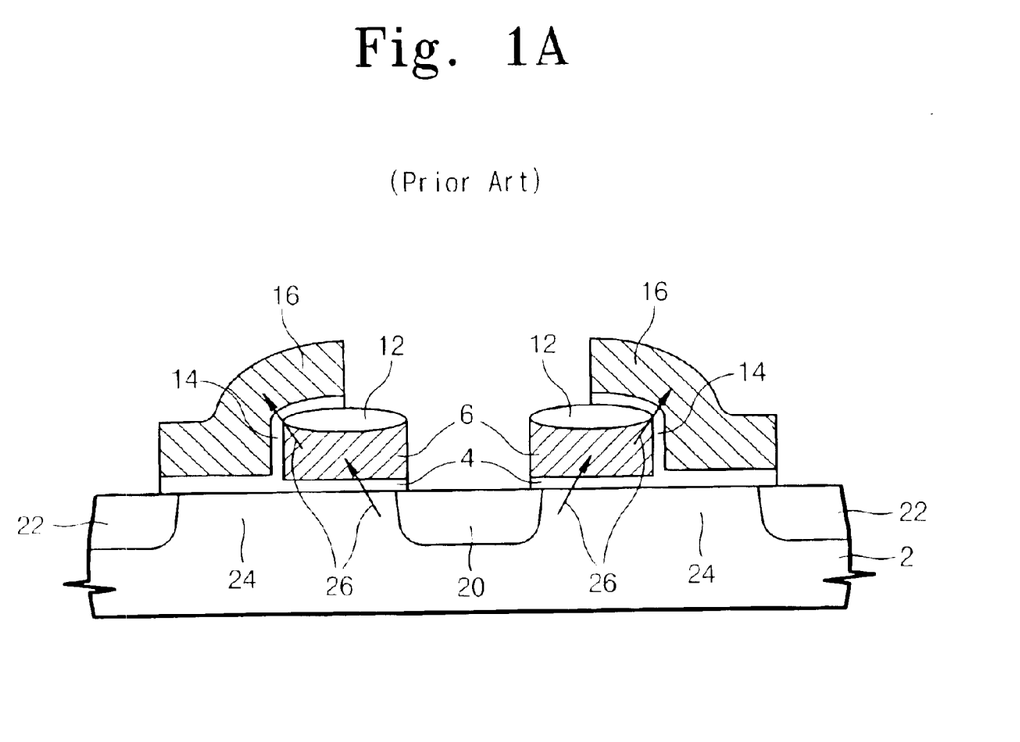
FIGS. 1A and 1B illustrate a cross-sectional view and a top plan view, respectively, of a conventional split gate memory device.
Figure 1B:
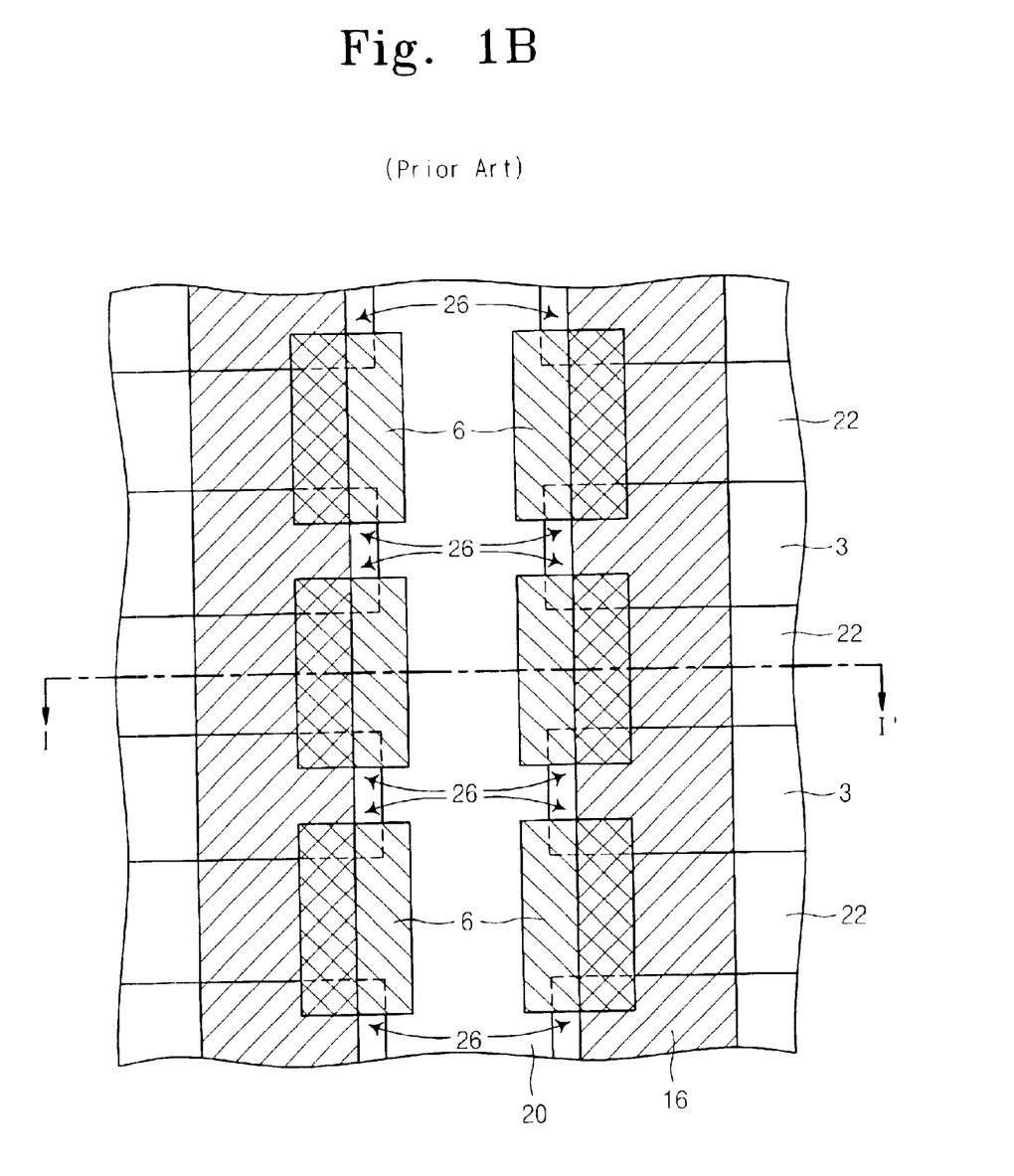

FIGS. 1A and 1B illustrate a cross-sectional view and a top plan view, respectively, of a split gate memory device according to the prior art. FIG. 1A illustrates a cross-sectional view taken along a line I–I' of FIG. 1B.

Referring to FIGS. 1A and 1B, an active region is defined in a p type substrate 2 by a device isolation region 3. A common source region 20 is formed at the active region and a drain region 22 is formed apart from the common source region 20. A channel region 24 is formed between the drain region 22 and the source region 20. Floating gates 6 are formed on a portion of the channel region 24 and a portion of the source region 20. A gate insulating layer 4 is interposed between the floating gates 6 and the active region. A polyoxide layer 12 is formed on the floating gates 6 by a local oxidation of silicon (LOCOS) process. A tunnel insulating layer 14 is formed, which covers one sidewall of each of the floating gates 6 and a portion of the channel region 24. Control gates 16 are formed on a portion of the tunnel insulating layer 14, a portion of the channel region 24, and a portion of the drain region 22. A top plane view of the control gates 16 is schematically illustrated in FIG. 1B. The control gate 16 of FIG. 1A corresponds to a word line of FIG. 1B.

To program the memory device, a predetermined voltage is applied to the control gate 16 and the source region 20 and then channel-hot electrons (CHEs) are injected into the floating gate 6 from the substrate 2 through the gate insulating layer 4. The electrons define a level of either "on" or "off".

The drain region 22 and the source region 20 are grounded during erasing. A predetermined voltage is applied to the control gate 16, so that electrons in the floating gate 6 move toward the control gate 16 (i.e., a word line) through the tunnel insulating layer 14 by Fowler-Nordheim tunneling (F-N tunneling). Arrows 26 indicate paths of electron movement during programming and erasing. During erasing, an electric field is concentrated at an acute section formed at a rim of the floating gate 6. The F-N tunneling occurs at the vicinity of the acute section. Thus, an effective erasing may be performed.

FIGS. 2A through 2F illustrate cross-sectional views for showing the steps of fabricating a split gate memory device according to the prior art.

Figure 2A:
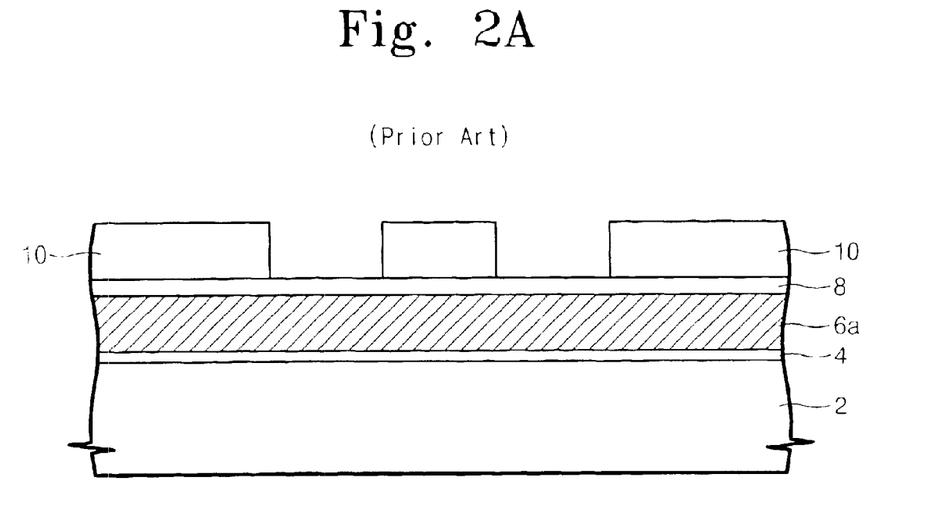
FIGS. 2A through 2F illustrate cross-sectional views for showing steps of a fabricating a conventional split gate memory device.

Referring to FIG. 2A, a thermal oxidation process is applied to grow a gate insulating layer 4 on a substrate 2. A first polysilicon layer 6a and a nitride layer 8 are formed on the gate insulating layer 4. Subsequently, a photoresist pattern 10 is formed by a conventional photolithography process.

Figure 2B:
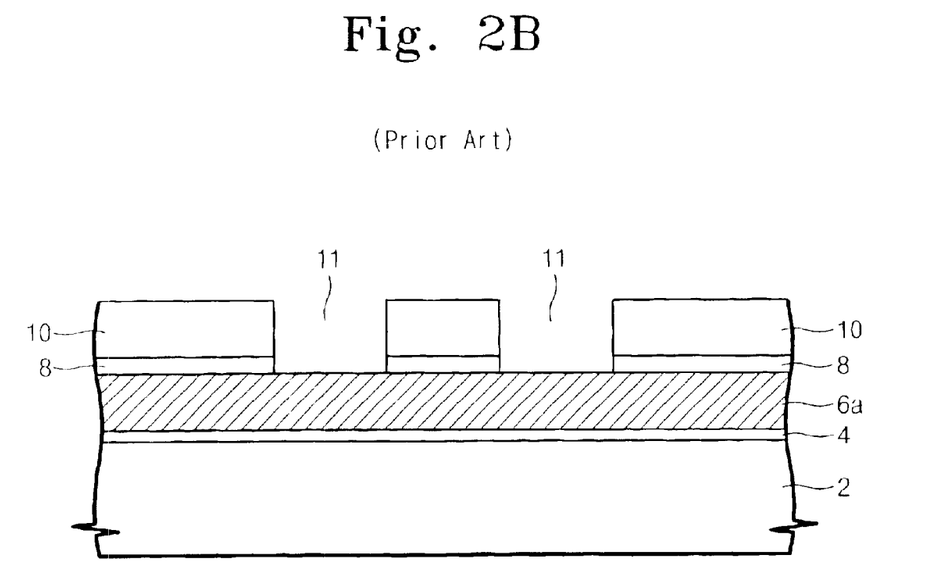

Referring to FIG. 2B, using the photoresist pattern 10 as an etching mask, the nitride layer 8 is selectively etched to form openings 11 exposing a surface of the first polysilicon layer 6a.

Figure 2C:
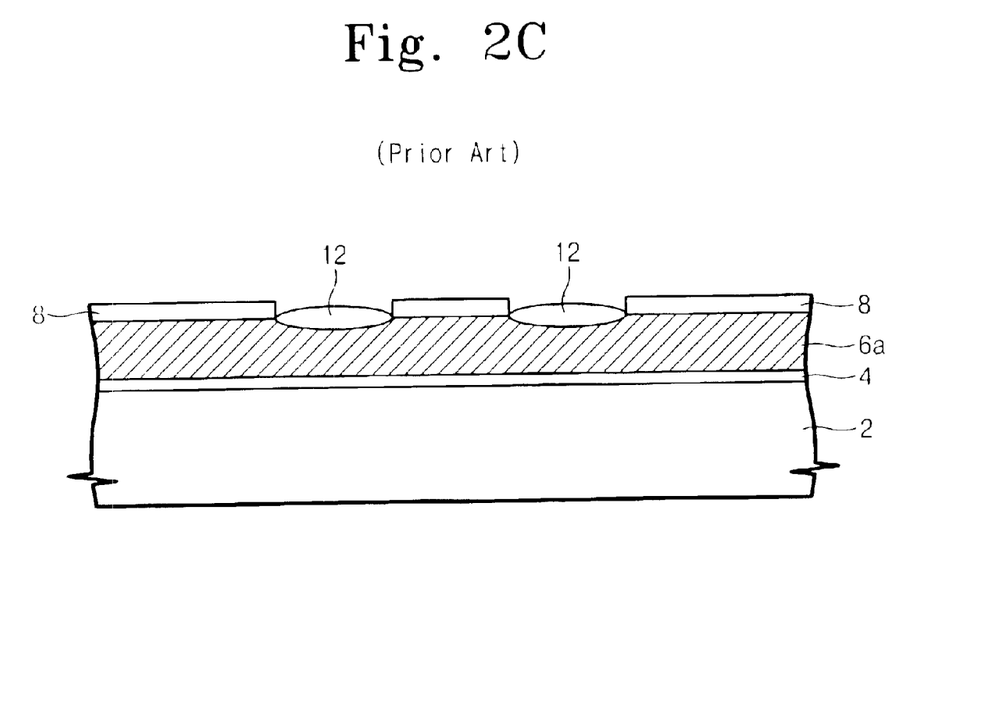

Referring to FIG. 2C, after the photoresist pattern 10 is removed, the exposed first polysilicon layer 6a is oxidized to form polyoxide layers 12.

Figure 2D:
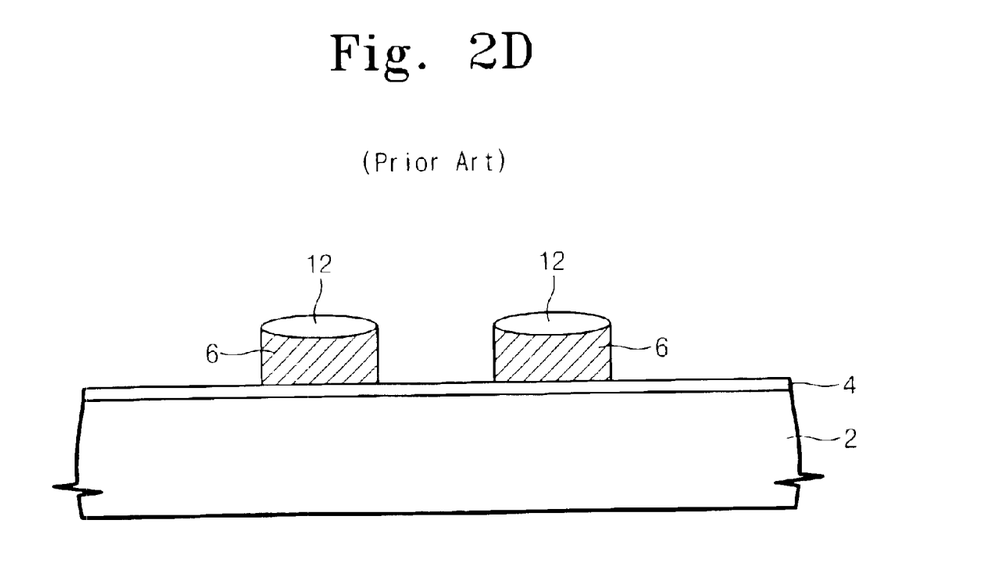

Referring to FIG. 2D, the nitride layer 8 is removed, and then the first polysilicon layer 6a is selectively etched to form floating gates 6 using polyoxide layers 12 as etching masks.

Figure 2E:
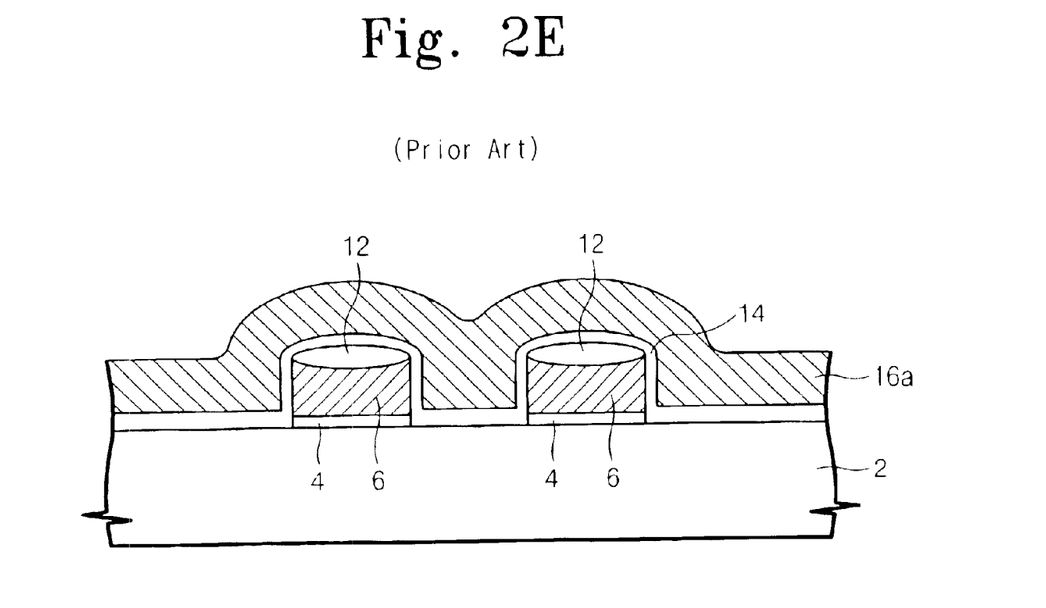

Referring to FIG. 2E, a tunnel oxide layer 14 is formed on an entire surface of the substrate 2 and then a second polysilicon layer 16a is formed on the tunnel oxide layer 14.

Figure 2F:
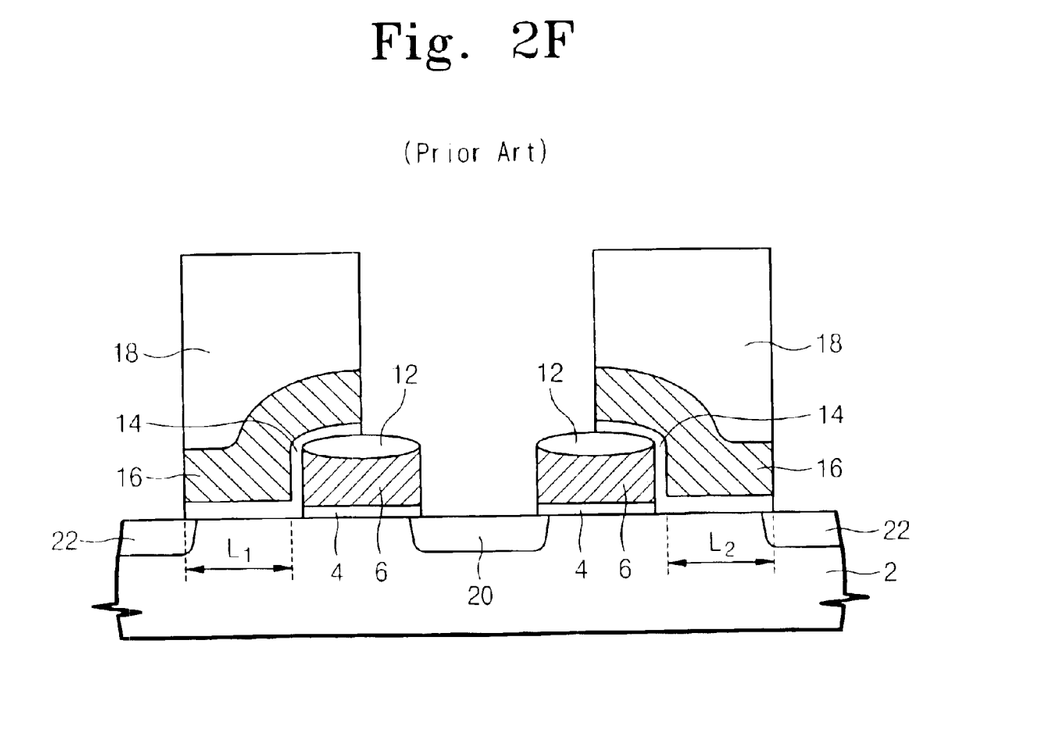

Referring to FIG. 2F, the second polysilicon layer 16a is selectively etched using a photoresist pattern 18 formed by a photolithography process to form control gates 16. In FIG. 2F, bottom widths L1 and L2 of the control gates 16 are identical because no misalignment occurs during the photolithography process for forming the control gates 16. Ions are implanted into the substrate 2 to form a source region 20 and drain regions 22 after the photoresist pattern 18 is removed, thereby completing a memory device as illustrated in FIG. 1A.

Although a typical split gate memory device as described above may prevent the problem of over-erasing data, the typical split gate memory described above may incur other problems as described below.

First, an acute section of the tunnel oxide layer 14 may be attacked during etching of a floating gate and ion implantation.

Second, misalignment may occur during the photolithographic process for forming the control gate 16.

Figure 3A:
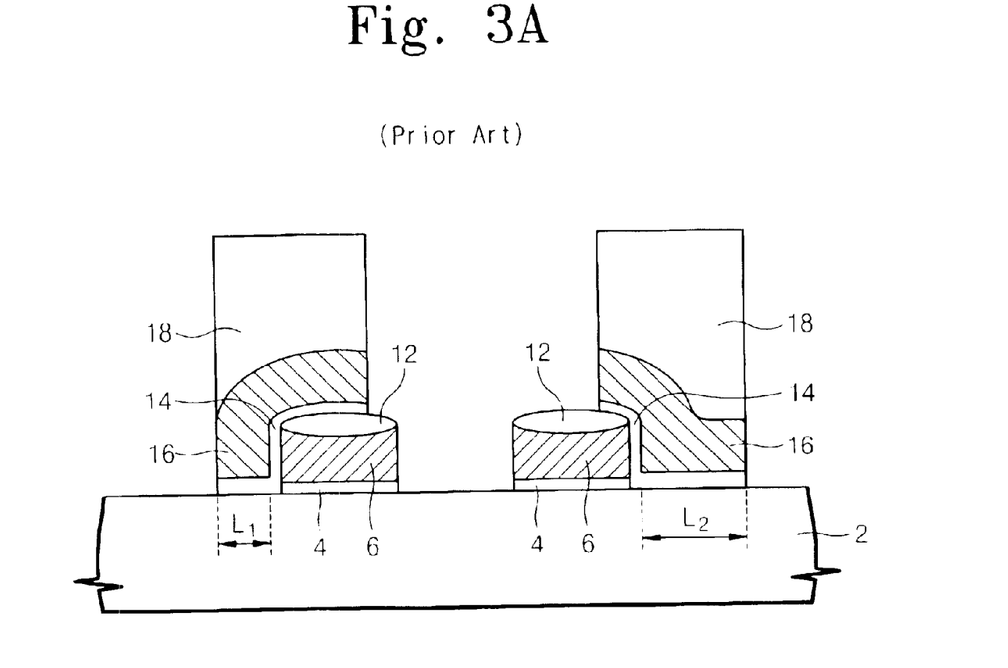
FIGS. 3A and 3B illustrate cross-sectional views showing misalignment due to a photolithography process for forming a control gate in a conventional split gate memory device.
Figure 3B:
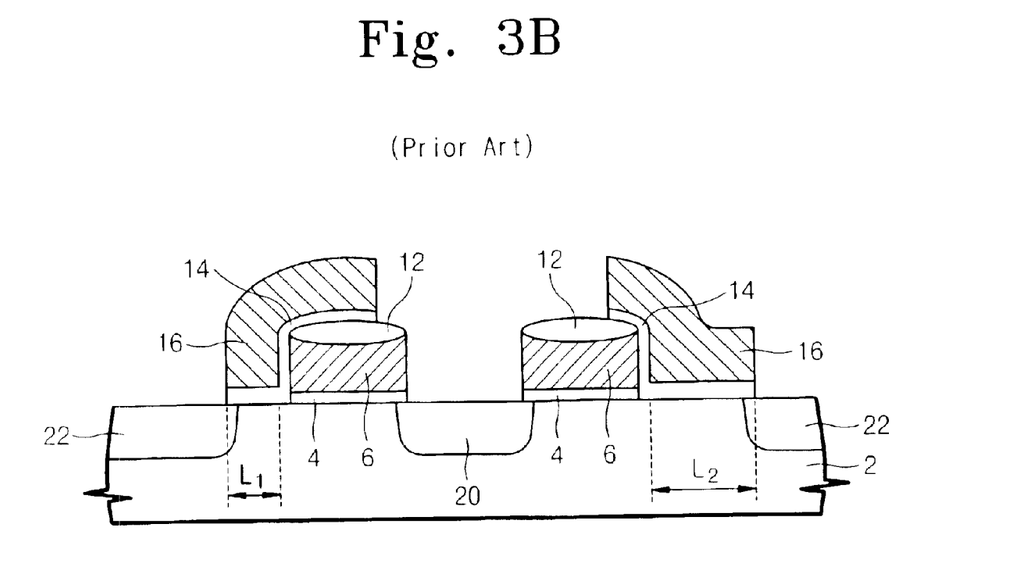

FIGS. 3A and 3B illustrate cross-sectional views for showing misalignment due to a photolithographic process for forming control gates 16 that commonly occurs in conventional split gate memory devices. When the misalignment occurs in the photolithographic process, a pair of transistors facing each other have different structures. Specifically, bottom widths L1 and L2 of the control gates 16 of the pair of transistors, respectively, are different from each other. In FIGS. 3A and 3B, L1 is shorter than L2.

When the control gates in a pair of transistors are formed having different bottom widths, cell current of one transistor differs from that of the other. Thus, dispersion of the cell becomes bad.

SUMMARY OF THE INVENTION

To overcome the problems described above, it is a feature of an embodiment of the present invention to provide a split gate memory device of which an acute section of a tunnel oxide layer is not attacked during etching of a control gate or during ion implantation for forming a source region, and in which an electric field is concentrated at the acute section of the tunnel oxide layer during data erasing.

It is another feature of an embodiment of the present invention to provide a method of fabricating the split gate memory device.

In accordance with a feature of an embodiment of the present invention, there is provided a split gate memory device having a pair of transistors facing each other, each of the transistors having a control gate, wherein bottom widths of the transistors are identical, and a fabricating method thereof.

A split gate memory device of an embodiment of the present invention includes a substrate, a source region and a drain region formed in the substrate and spaced a predetermined distance apart, a channel region formed between the source region and the drain region, a floating gate formed on a portion of the channel region and a portion of the source region with a gate insulating layer interposed therebetween, a capping insulating layer formed on a portion of a top surface of the floating gate, and a control gate formed on sidewalls of the floating gate and the capping insulating layer with a tunnel insulating layer interposed therebetween.

The control gate is preferably self-aligned to the floating gate and the capping insulating layer.

The floating gate and the control gate are preferably formed of polysilicon. A polyoxide layer may be formed on the floating gate by thermal oxidation of the floating gate. The capping insulating layer is preferably a silicon nitride layer.

In accordance with another feature of an embodiment of the present invention, there is provided a split gate memory device including a substrate, a common source region formed in the substrate, drain regions formed in the substrate symmetrically spaced a predetermined distance from the common source region, channel regions formed between the common source region and the drain regions, a pair of floating gates formed on the substrate on a portion of each of the channel regions and a portion of the source region with a gate insulating layer interposed between the floating gates and the substrate, a capping insulating layer formed at a portion of a top surface of each of the floating gates with an inter-gate insulating layer interposed therebetween, and a pair of control gates formed with a tunnel insulating layer interposed between the control gates and sidewalls of the floating gates and the capping insulating layer.

Bottom widths of each of the control gates are preferably identical. The floating gate and the control gate are preferably formed of polysilicon. The inter-gate insulating layer is preferably a polyoxide layer. The capping insulating layer is preferably a silicon nitride layer.

In accordance with another feature of an embodiment of the present invention, there is provided a method of fabricating a split gate memory device including forming a gate insulating layer and a floating gate layer on a substrate, patterning a predetermined region of the floating gate layer to form a floating gate pattern, forming a capping insulating layer on portions of the floating gate pattern, forming a pair of control gates with a tunnel insulating layer interposed between the control gates and both sidewalls of the floating gate pattern and the capping insulating layer, selectively etching the capping insulating layer, the floating gate pattern, and the gate insulating layer until a portion of the substrate is exposed, thereby forming a pair of floating gates, forming a common source region by implanting ions into the exposed portion of the substrate, and forming drain regions by implanting ions into a portion of the substrate adjoining the control gates.

Forming the control gates preferably includes forming a tunnel insulating layer on an entire surface of the substrate having the floating gate pattern and the capping insulating layer, forming a control gate layer on the tunnel insulating layer, and anisotropically etching the control gate layer and the tunnel insulating layer until the capping insulating layer is exposed.

The floating gate layer and the control gate layer may be formed of polysilicon. An inter-gate insulating layer may be formed on the floating gate layer. The inter-gate insulating layer may be formed by forming a silicon nitride layer on the floating gate layer, selectively etching a predetermined region of the silicon nitride layer to expose a portion of the floating gate layer, thermally oxidizing the exposed portion of the floating gate layer, and removing the silicon nitride layer.

In accordance with another feature of an embodiment of the present invention, there is provided a method of fabricating a split gate memory device including sequentially forming a gate insulating layer and a first polysilicon layer on a substrate, forming a polyoxide layer on a predetermined region of the first polysilicon layer, patterning the first polysilicon layer using the polyoxide layer as an etching mask, forming a capping insulating layer pattern on a portion of the patterned first polysilicon layer having the polyoxide layer, forming a tunnel insulating layer and a second polysilicon layer on an entire surface of the substrate including the patterned first polysilicon layer and capping insulating layer, anisotropically etching the second polysilicon layer and the tunnel insulating layer to form a pair of control gates that are self-aligned to the second polysilicon layer and the capping insulating layer pattern with the tunnel insulating layer interposed on sidewalls of the patterned first polysilicon layer and capping insulating layer pattern, selectively etching the capping insulating layer pattern, the polyoxide layer, the patterned first polysilicon layer and the gate insulating layer until a portion of the substrate is exposed to form a pair of floating gates, implanting ions into the exposed portion of the substrate to form a common source region, and implanting ions into a portion of the substrate adjoining the control gates to form drain regions. The capping insulating layer is preferably a silicon nitride layer.

Forming the polyoxide layer preferably includes forming a silicon nitride layer on the first polysilicon layer, selectively etching a predetermined region of the silicon nitride layer to expose a surface of the first polysilicon layer, oxidizing the exposed surface of the first polysilicon layer, and removing the silicon nitride layer.

In an embodiment of the present invention, the capping insulating layer prevents an acute section of the tunnel insulating layer from being attacked during etching of the floating gate and during ion implantation for forming the source region.

Also by the present invention, because the bottom widths of the control gates are identical, an identical cell current may be achieved during programming.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-26907, filed on May 15, 2002, and entitled: "Split Gate Memory Device And Fabricating Method Thereof" is incorporated by reference herein in its entirety.

The present invention will now be described more fully with reference to the accompanying drawings, in which preferred embodiments of the invention are shown.

Figure 4:
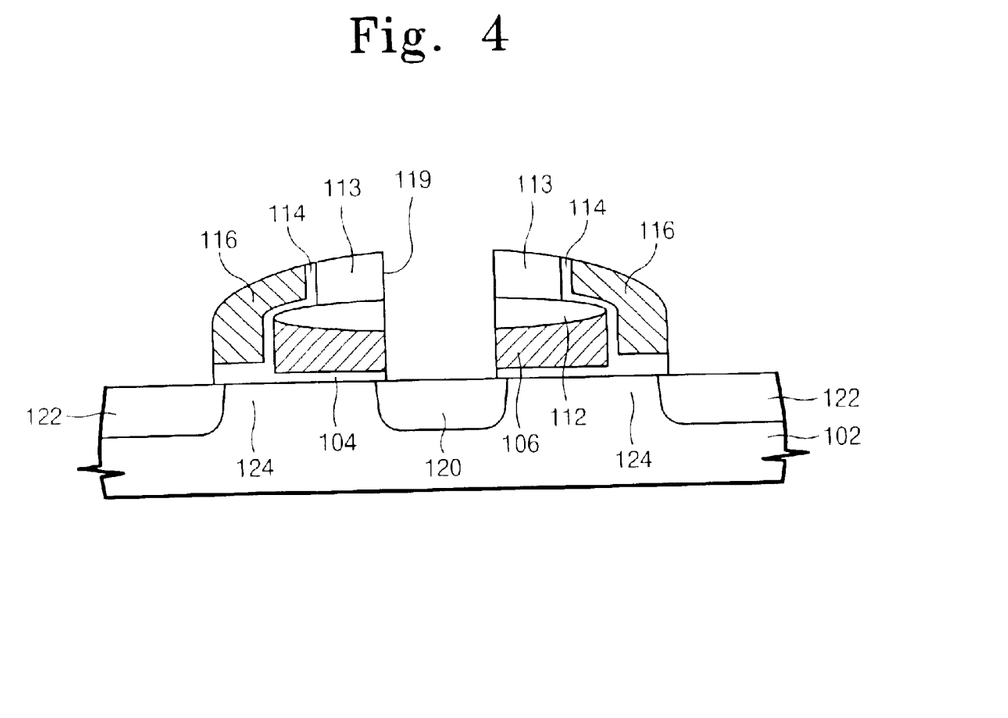
FIG. 4 illustrates a cross-sectional view of a split gate memory device in accordance with a first preferred embodiment of the present invention.

FIG. 4 illustrates a cross-sectional view showing a split gate memory device according to a first embodiment of the present invention.

Referring to FIG. 4, a common source region 120 is formed in a p-type semiconductor substrate 102. Drain regions 122 are formed to be symmetrically separated from the common source region 120 by a predetermined distance. A channel region 124 is formed between the drain region 122 and the source region 120. Floating gates 106 are formed on a portion of the channel region 124 and a portion of the source region 120 with a gate insulating layer 104 interposed therebetween, respectively. Polyoxide layers 112 are formed on the floating gates 106 by a local oxidation of silicon (LOCOS) process.

Control gates 116 are formed on sidewalls of the floating gate 106 and a capping insulating layer pattern 113 with a tunnel insulating layer 114 interposed therebetween.

FIGS. 5A through 5I illustrate cross-sectional views for showing a method of fabricating a split gate memory device in accordance with a preferred embodiment of the present invention.

Figure 5A:
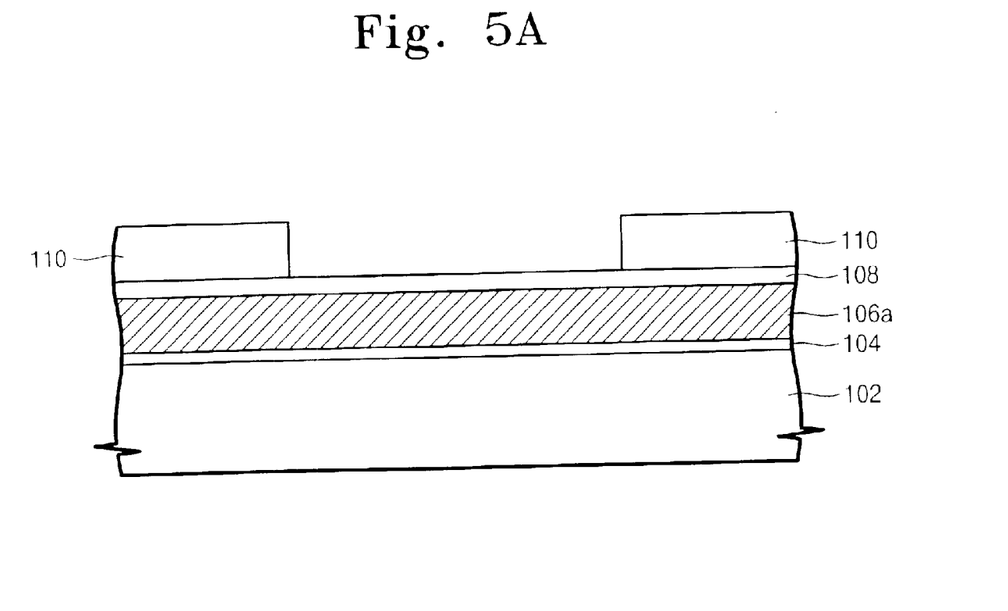
FIGS. 5A through 5I illustrate cross-sectional views for showing a method of fabricating the split gate memory device in accordance with the first preferred embodiment of the present invention.

Referring to 5A, a substrate 102 is thermally oxidized to form a gate insulating layer 104. A first polysilicon layer 106a and a nitride layer 108 are formed on the gate insulating layer 104. A photolithographic process is applied to form photoresist patterns 110 on the nitride layer 108.

Figure 5B:
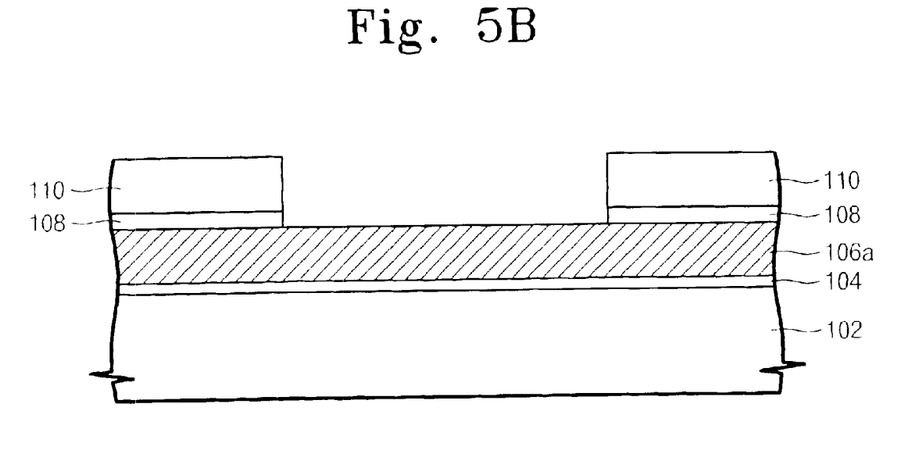

Referring to FIG. 5B, the nitride layer 108 is selectively etched using the photoresist patterns 110 as etching masks, thereby exposing a portion of the first polysilicon layer 106a.

Figure 5C:
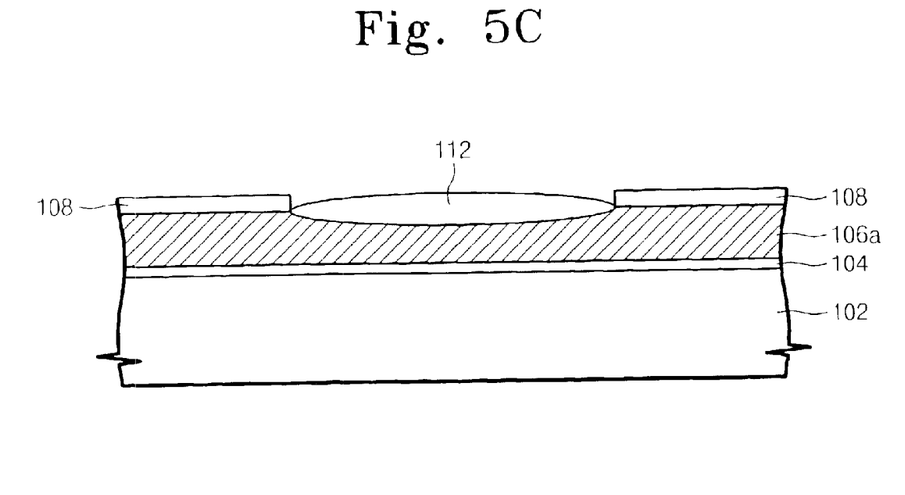

Referring to FIG. 5C, the photoresist pattern 110 is removed. Then, the exposed first polysilicon layer 106a is oxidized to form a polyoxide layer 112 corresponding to an inter-gate insulating layer.

Figure 5D:
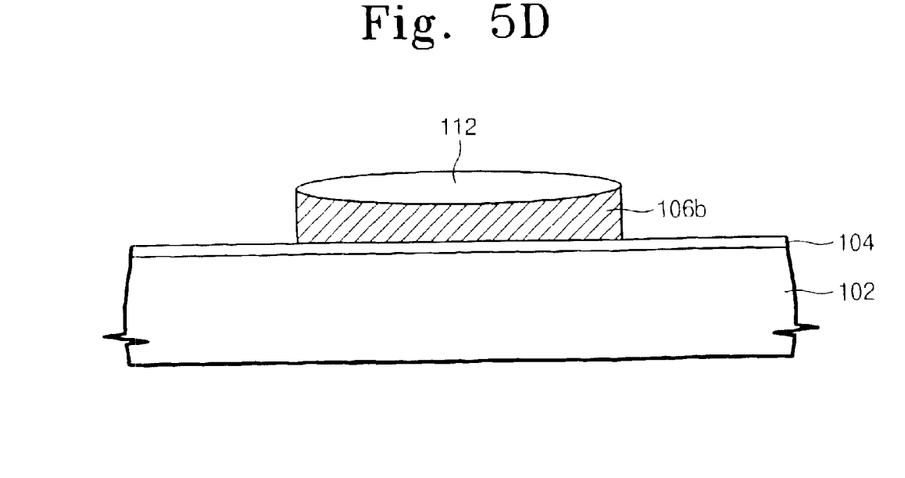

Referring to FIG. 5D, the patterned nitride layer 108 is removed. The first polysilicon layer 106a is patterned using the polyoxide layer 112 as a mask to form a first polysilicon layer pattern 106b. The gate insulating layer 104 under the first polysilicon layer 106a may be entirely or partially etched.

Figure 5E:
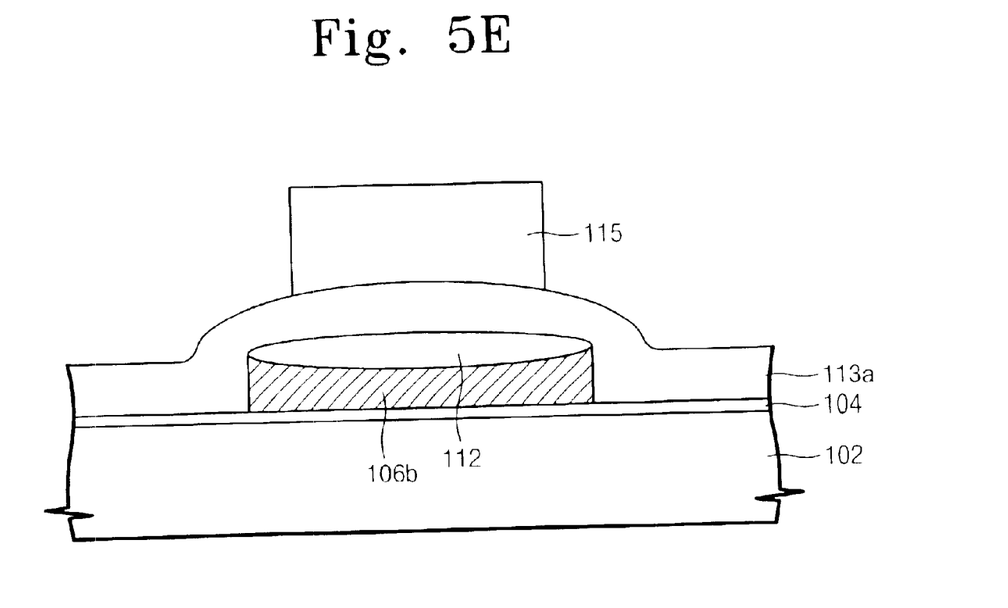

Referring to FIG. 5E, a capping insulating layer 113a is formed on an entire surface of the substrate including the first polysilicon layer pattern 106b and the polyoxide layer 112. The capping insulating layer 113a is preferably formed of nitride and preferably has a thickness of 200–100000 Å.

Figure 5F:
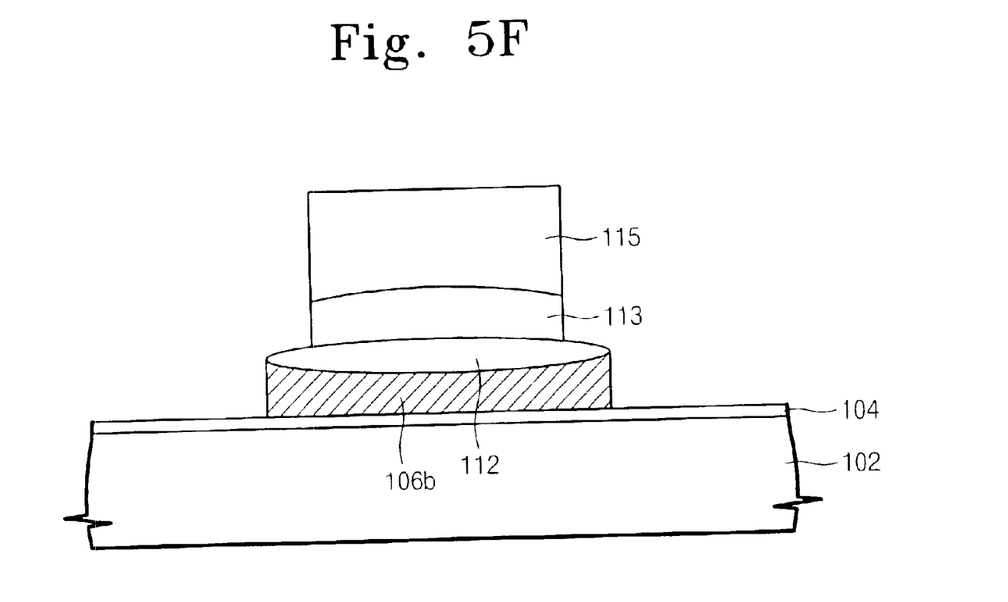

Referring to FIG. 5F, a photoresist pattern 115 is formed on the capping insulating layer 113a. The photoresist pattern 115 is disposed on the first polysilicon layer pattern 106b. The capping insulating layer 113a is patterned using the photoresist pattern 115 as an etching mask to form a capping insulating layer pattern 113.

Figure 5G:
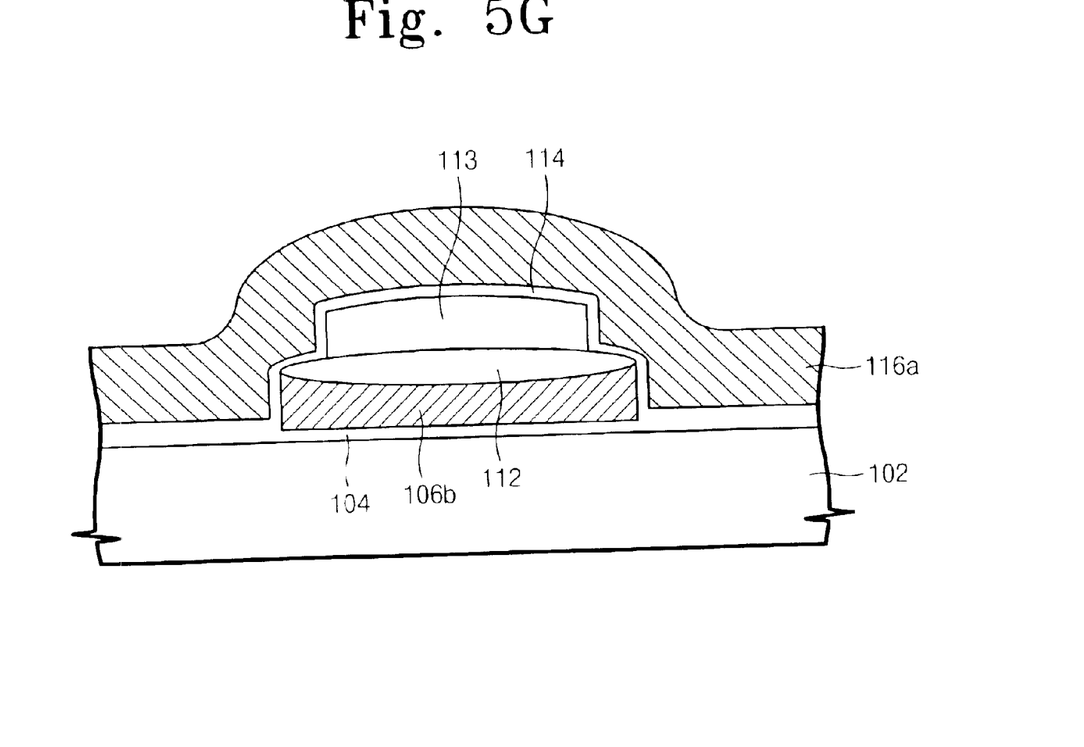

Referring to FIG. 5G, after the photoresist pattern 115 is removed, a tunnel insulating layer 114 is formed on an entire surface of the semiconductor substrate having the first polysilicon layer pattern 106b and the capping insulating layer pattern 113. The tunnel insulating layer 114 may be formed by a thermal oxidation process or a chemical vapor deposition (CVD) process. Subsequently, a second polysilicon layer 116a is formed on the tunnel insulating layer 114.

Figure 5H:
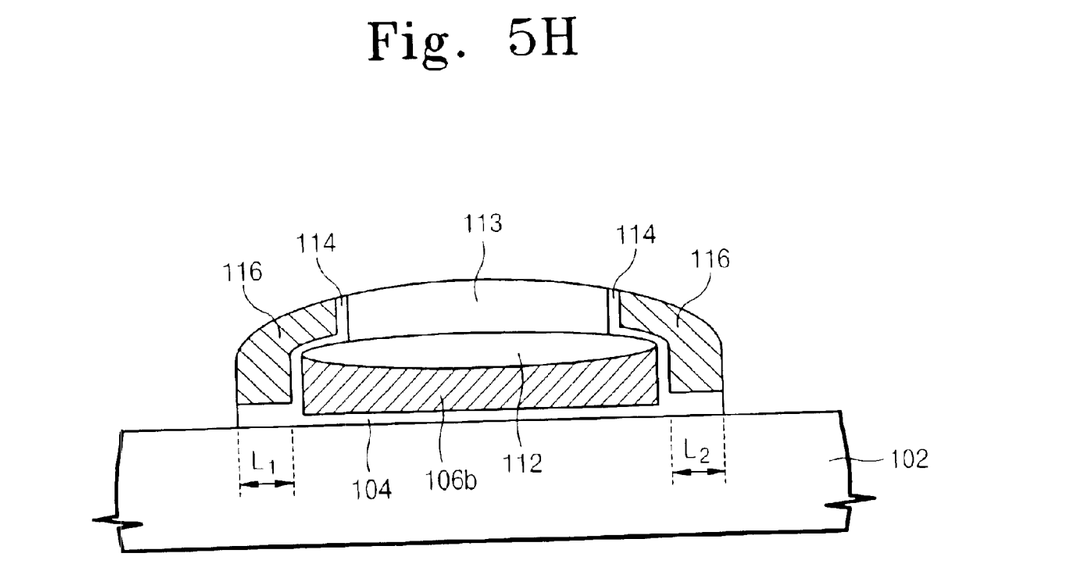

Referring to FIG. 5H, the entire second polysilicon layer 116a is anisotropically etched until a surface of the capping insulating layer pattern 113 is exposed, thereby forming a pair of control gates 116 at both sides of the first polysilicon layer pattern 106b and the capping insulating layer pattern 113. The tunnel insulating layer 114 is interposed between each of the control gates 116 and a respective sidewall of the first polysilicon layer pattern 106b, and between each of the control gates 116 and a respective sidewall of the capping insulating layer pattern 113. The control gates 116 are spacers aligned to the first polysilicon layer pattern 106b and the capping insulating layer pattern 113. Thus, bottom widths L1 and L2 of the control gates 116, respectively, may be identical, so that identical cell currents may be obtained in each cell of the memory device during programming. In addition, the bottom widths L1 and L2 of the control gates 116, respectively, may be adjusted. That is, the bottom widths L1 and L2 may be dependent on the thickness of the capping insulating layer pattern 113 and the second polysilicon layer pattern 116b.

Figure 5I:
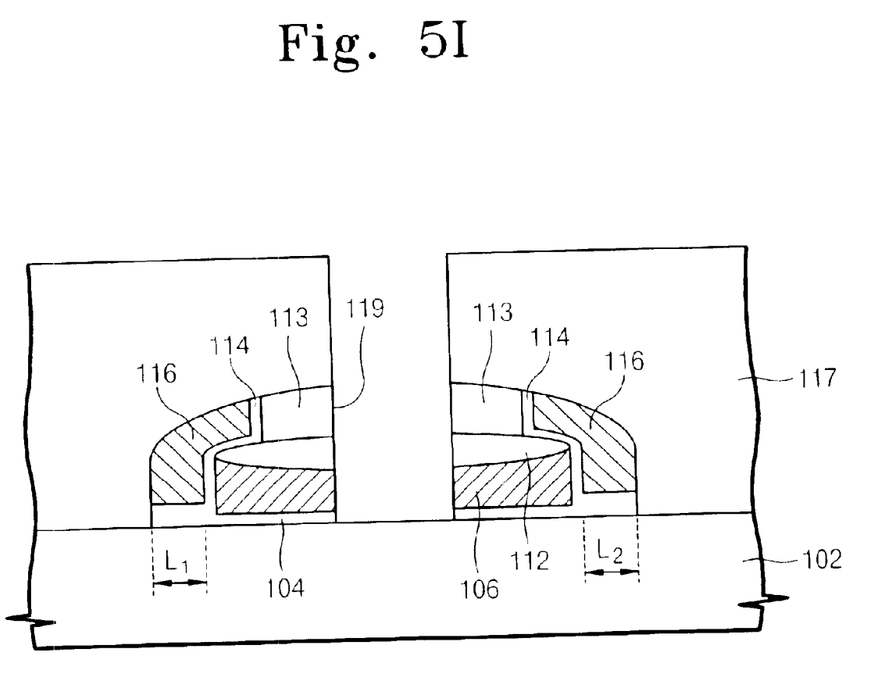

Referring to FIG. 5I, a photoresist pattern 117 is formed on an entire surface of the substrate. The photoresist pattern 117 has an opening at a central portion of the capping insulating layer pattern 113. Using the photoresist pattern 117 as an etching mask, the capping insulating layer pattern 113, the polyoxide layer 112, the first polysilicon layer pattern 106b and the gate insulating layer 104 are successively etched until a surface of the substrate 102 is exposed, to form a pair of floating gates 106. The capping insulating layer pattern 113 may prevent acute sections of the tunnel insulating layers 114 from being attacked.

Referring to FIG. 4 again, the photoresist pattern 117 is removed and then a common source region 120 is formed by implanting ions into the exposed substrate. The capping insulating layer patterns 113 may prevent acute sections of the tunnel insulating layers 114 from being damaged during the ion implanting process for forming the common source region 120. Drain regions 122 are formed by implanting ions into a substrate adjoining the control gates 116.

As described above, the present invention allows bottom widths of control gates to be identical, so that identical cell currents may be obtained in each cell of the memory device during programming. Further, the present invention can prevent acute sections of the tunnel insulating layers from being damaged during etching and ion implantation processes by forming a capping insulating layer.

Moreover, bottom widths of the control gates may be adjusted to a thickness of the floating gate and the capping insulating layer.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A split gate memory device, comprising:
   a substrate;
   a source region and a drain region formed in the substrate and spaced a predetermined distance apart;
   a channel region formed between the source region and the drain region;
   a floating gate formed on a portion of the channel region and a portion of the source region with a gate insulating layer interposed therebetween;
   a capping insulating layer formed on a portion of a top surface of the floating gate; and
   a control gate formed on sidewalls of the floating gate and the capping insulating layer with a tunnel insulating layer interposed therebetween.

2. The split gate memory device as claimed in claim 1, wherein the floating gate and the control gate are formed of polysilicon.

3. The split gate memory device as claimed in claim 2, further comprising a polyoxide layer formed on the floating gate by thermal oxidation of the floating gate.

4. The split gate memory device as claimed in claim 1, wherein the capping insulating layer is a silicon nitride layer.

5. A split gate memory device, comprising:
- a substrate;
  - a common source region formed in the substrate;
  - drain regions formed in the substrate symmetrically spaced a predetermined distance from the common source region;
  - channel regions formed between the common source region and the drain regions;
  - a pair of floating gates formed on the substrate on a portion of each of the channel regions and a portion of the source region with a gate insulating layer interposed between the floating gates and the substrate;
  - a capping insulating layer formed at a portion of a top surface of each of the floating gates with an inter-gate insulating layer interposed therebetween; and
  - a pair of control gates formed with a tunnel insulating layer interposed between the control gates and sidewalls of the floating gates and the capping insulating layer.

6. The split gate memory device as claimed in claim 5, wherein bottom widths of each of the control gates are identical.

7. The split gate memory device as claimed in claim 5, wherein the floating gate and the control gate are formed of polysilicon.

8. The split gate memory device as claimed in claim 7, wherein the inter-gate insulating layer is a polyoxide layer.

9. The split gate memory device as claimed in claim 5, wherein the capping insulating layer is a silicon nitride layer.

* * * * *